US012619161B2

(12) United States Patent
Staals

(10) Patent No.: US 12,619,161 B2
(45) Date of Patent: May 5, 2026

(54) METHOD FOR INFERRING A PROCESSING PARAMETER SUCH AS FOCUS AND ASSOCIATED APPARATUSES AND MANUFACTURING METHOD

(71) Applicant: ASML NETHERLANDS B.V., Veldhoven (NL)

(72) Inventor: Frank Staals, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 839 days.

(21) Appl. No.: 17/762,863

(22) PCT Filed: Sep. 7, 2020

(86) PCT No.: PCT/EP2020/074900
§ 371 (c)(1),
(2) Date: Mar. 23, 2022

(87) PCT Pub. No.: WO2021/058268
PCT Pub. Date: Apr. 1, 2021

(65) Prior Publication Data
US 2022/0357672 A1     Nov. 10, 2022

(30) Foreign Application Priority Data

Sep. 26, 2019   (EP) ..................................... 19199804

(51) Int. Cl.
*G03F 7/00*              (2006.01)
(52) U.S. Cl.
CPC ...... *G03F 7/70625* (2013.01); *G03F 7/70641* (2013.01); *G03F 7/70683* (2013.01)
(58) Field of Classification Search
CPC ............. G03F 7/70625; G03F 7/70641; G03F 7/70683; G03F 7/706845
See application file for complete search history.

(56) References Cited

U.S. PATENT DOCUMENTS

| | | | |
|---|---|---|---|
| 10,831,107 B2 * | 11/2020 | Sokolov | .............. G03F 7/70625 |
| 2006/0033921 A1 | 2/2006 | Den Boef et al. | |
| 2010/0201963 A1 | 8/2010 | Cramer et al. | |
| 2010/0328655 A1 | 12/2010 | Den Boef | |

(Continued)

FOREIGN PATENT DOCUMENTS

| | | |
|---|---|---|
| CN | 105988307 | 10/2016 |
| CN | 107710073 | 2/2018 |

(Continued)

OTHER PUBLICATIONS

International Search Report and Written Opinion issued in corresponding PCT Patent Application No. PCT/EP2020/074900, dated Jan. 11, 2021.

(Continued)

*Primary Examiner* — Nghia M Doan
(74) *Attorney, Agent, or Firm* — Pillsbury Winthrop Shaw Pittman, LLP

(57) ABSTRACT

A method of inferring a value for a first processing parameter of a lithographic process, the first processing parameter being subject to a coupled dependency of a second processing parameter. The method includes determining a first metric and a second metric from measurement data, each of the first metric and second metric being dependent on both the first processing parameter and second processing parameter The first metric shows a stronger dependence to the first processing parameter than the second processing parameter and the second metric shows a stronger dependence to the second processing parameter than the first processing parameter. The value for the first processing parameter is inferred from the first and second metrics.

20 Claims, 7 Drawing Sheets

(56) References Cited

U.S. PATENT DOCUMENTS

| | | | |
|---|---|---|---|
| 2011/0027704 A1 | 2/2011 | Cramer et al. | |
| 2011/0043791 A1 | 2/2011 | Smilde et al. | |
| 2011/0069292 A1 | 3/2011 | Den Boef | |
| 2011/0102753 A1 | 5/2011 | Van De Kerkhof et al. | |
| 2012/0044470 A1 | 2/2012 | Smilde et al. | |
| 2012/0123581 A1 | 5/2012 | Smilde et al. | |
| 2013/0258310 A1 | 10/2013 | Smilde et al. | |
| 2013/0271740 A1 | 10/2013 | Quintanilha | |
| 2015/0293458 A1 | 10/2015 | Vanoppen et al. | |
| 2016/0011523 A1* | 1/2016 | Singh | G01N 21/4788 |
| | | | 355/77 |
| 2016/0274456 A1* | 9/2016 | Chen | G03F 7/70683 |
| 2016/0363871 A1 | 12/2016 | Van Oosten et al. | |
| 2017/0023867 A1 | 1/2017 | Staals et al. | |
| 2017/0177760 A1* | 6/2017 | Socha | G03F 7/2002 |
| 2019/0025707 A1 | 1/2019 | Den Boef et al. | |

FOREIGN PATENT DOCUMENTS

| | | |
|---|---|---|
| TW | 201802453 | 1/2018 |
| WO | 2013178422 | 12/2013 |
| WO | 2017108395 | 6/2017 |
| WO | 2017186483 | 11/2017 |
| WO | 2019110211 | 6/2019 |

OTHER PUBLICATIONS

Taiwanese Office Action issued in corresponding Taiwanese Patent Application No. 108142241, dated Jun. 10, 2021.

Office Action issued in corresponding Korean Patent Application No. 10-2022-7013314, dated Sep. 10, 2024.

Office Action issued in corresponding Chinese Patent Application No. 202080075093, dated Jan. 25, 2025.

* cited by examiner (a)

(b)

(a)          (b)

(c)

METHOD FOR INFERRING A PROCESSING PARAMETER SUCH AS FOCUS AND ASSOCIATED APPARATUSES AND MANUFACTURING METHOD

CROSS-REFERENCE TO RELATED APPLICATIONS

This application is the U.S. national phase entry of PCT Patent Application No. PCT/EP2020/074900 which was filed on Sep. 7, 2020, which claims the benefit of priority of European Patent Application No. 19199804.6 which was filed on Sep. 26, 2019 and which is incorporated herein in its entirety by reference.

BACKGROUND

Field of the Invention

The present invention relates to a metrology apparatus and methods usable, for example, to perform metrology in the manufacture of devices by lithographic techniques. The invention further relates to such methods for monitoring a focus parameter in a lithographic process.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

Examples of known scatterometers include angle-resolved scatterometers of the type described in US2006033921A1 and US2010201963A1. The targets used by such scatterometers are relatively large, e.g., 40 μm by 40 μm, gratings and the measurement beam generates a spot that is smaller than the grating (i.e., the grating is under-filled). Examples of dark field imaging metrology can be found in international patent applications US20100328655A1 and US2011069292A1 which documents are hereby incorporated by reference in their entirety.

Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

One important parameter of a lithographic process which requires monitoring is focus. There is a desire to integrate an ever-increasing number of electronic components in an IC. To realize this, it is necessary to decrease the size of the components and therefore to increase the resolution of the projection system, so that increasingly smaller details, or line widths, can be projected on a target portion of the substrate. As the critical dimension (CD) in lithography shrinks, consistency of focus, both across a substrate and between substrates, becomes increasingly important. CD is the dimension of a feature or features (such as the gate width of a transistor) for which variations will cause undesirable variation in physical properties of the feature. Traditionally, optimal settings were determined by "send-ahead wafers" i.e. substrates that are exposed, developed and measured in advance of a production run. In the send-ahead wafers, test structures were exposed in a so-called focus exposure matrix (FEM) and the best focus and energy settings were determined from examination of those test structures.

Focus and dose are cross-linked terms, and therefore focus inference is affected by any variation of effective dose from assumed dose.

SUMMARY OF THE INVENTION

The present invention aims to address the issue of the effect of dose on focus inference.

The invention in a first aspect provides a method of inferring a value for a first processing parameter of a lithographic process, the method comprising: determining a first metric and a second metric from measurement data relating to a structure on a substrate formed using the lithographic process, each of the first metric and second metric being dependent on both the first processing parameter and a second processing parameter, the first metric having a different dependence on the first processing parameter than the second processing parameter and the second metric having a different dependence on the second processing parameter than the first processing parameter; and inferring the value for the first processing parameter from said first metric and second metric.

The invention in a second aspect provides a method of inferring a focus value from a target having been formed with a focus dependent asymmetry, relating to focus during formation of said target in a lithographic process, the method comprising: determining an asymmetry metric and a sum metric from measurement data, the asymmetry metric being based on a difference in intensity of complementary diffraction orders from diffraction of measurement radiation following measurement of the target; and the sum metric is based on the sum of the intensities of said complementary diffraction orders; and inferring the focus value from said asymmetry metric and said sum metric.

The invention in a third aspect comprises method of determining a calibration plane for performing a calibration in a lithographic process; the method comprising: determining a calibration relationship based on calibration measurements relating to at least one structure on a substrate formed using the lithographic process at different values for a first processing parameter and a second processing parameter, the calibration relationship describing the relationship of a first metric against a second metric for different values of said first processing parameter and said second processing parameter, wherein each of the first metric and second metric is dependent on both the first processing parameter and second processing parameter, the first metric having a stronger dependence on the first processing parameter than the second processing parameter and the second metric having a stronger dependence on the second processing parameter than the first processing parameter; and fitting a calibration plane to a constant value for the second processing parameter.

The invention yet further provides a computer program product comprising machine-readable instructions for causing a processor to perform the method of the first, second and/or third aspect, and associated metrology apparatus, lithographic system and method of manufacturing devices.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

Before describing embodiments of the invention in detail, it is instructive to present an example environment in which embodiments of the present invention may be implemented.

Figures 1, 2:
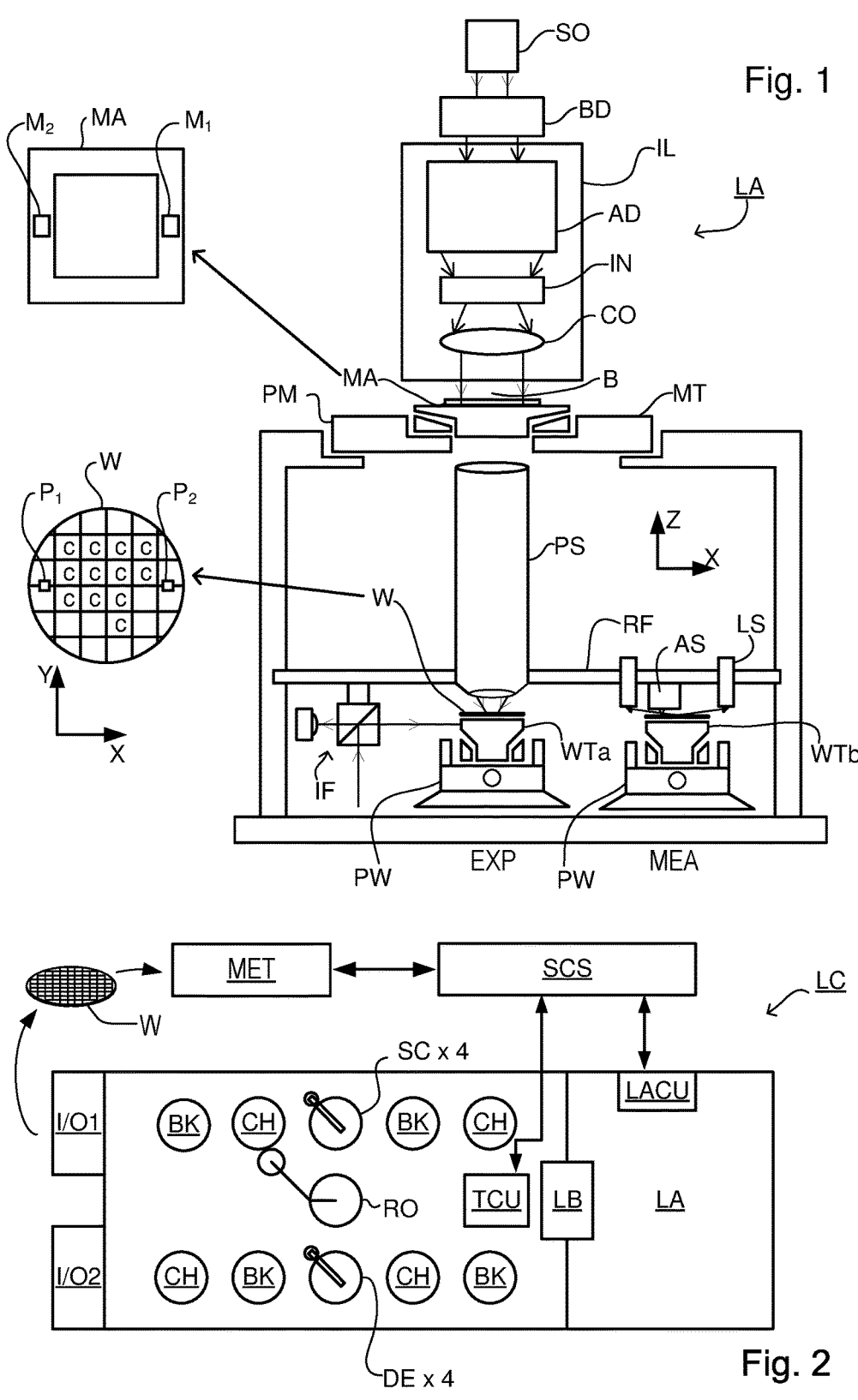
FIG. 1 depicts a lithographic apparatus.
FIG. 2 depicts a lithographic cell or cluster in which an inspection apparatus according to the present invention may be used.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can take many forms; the patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., reticle/mask) MA with respect to the path of the radiation beam B, e.g., after mechanical retrieval from a mask library, or during a scan.

Patterning device (e.g., reticle/mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks) Similarly, in situations in which more than one die is provided on the patterning device (e.g., mask) MA, the mask alignment marks may be located between the dies. Small alignment mark may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates, especially if the inspection can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

A metrology apparatus suitable for use in embodiments of the invention is shown in FIG. 3(a). Note that this is only one example of a suitable metrology apparatus. An alternative suitable metrology apparatus may use EUV radiation such as, for example, that disclosed in WO2017/186483A1. A target structure T and diffracted rays of measurement radiation used to illuminate the target structure are illustrated in more detail in FIG. 3(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 3(b), target structure T is placed with substrate W normal to the optical axis O of objective lens 16. The substrate W may be supported by a support (not shown). A ray of measurement radiation I impinging on target structure T from an angle off the axis O gives rise to a zeroth order ray (solid line 0) and two first order rays (dot-chain line +1 and double dot-chain line −1). It should be remembered that with an overfilled small target structure, these rays are just one of many parallel rays covering the area of the substrate including metrology target structure T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the target structures and the illumination angles can be designed or adjusted so that the first order rays entering the objective lens are closely aligned with the central optical axis. The rays illustrated in FIGS. 3(a) and 3(b) are shown somewhat off axis, purely to enable them to be more easily distinguished in the diagram.

At least the 0 and +1 orders diffracted by the target structure T on substrate W are collected by objective lens 16 and directed back through beam splitter 15. Returning to FIG. 3(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled 1(S)) are the ones which enter the lens 16.

A second beam splitter 17 divides the diffracted beams into two measurement branches. In a first measurement branch, optical system 18 forms a diffraction spectrum (pupil plane image) of the target structure on first sensor 19

(e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target structure T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

When monitoring a lithographic process, it is desirable to monitor focus of the lithography beam on the substrate. One known method of determining the focus setting from a printed structure is by measuring the critical dimension (CD) of the printed structure. CD is a measure of the smallest feature (e.g., line width of an element). The printed structure may be a target, such as a line-space grating, formed specifically for focus monitoring. It is known that CD usually displays $2^{nd}$ order response to focus, forming what is known as a "Bossung curve" on a plot of CD (y-axis) against focus (x-axis). A Bossung curve is a substantially symmetrical curve which is substantially symmetrical around a peak representing the best focus. The Bossung curve may be substantially parabolic in shape. There are several drawbacks to this approach. One drawback is that the method shows low sensitivity near best focus (due to the parabolic shape of the curve). Another drawback is that the method is insensitive to the sign of any defocus (as the curve is largely symmetrical around best focus). Also this method is sensitive to inter alia dose and process variation (crosstalk).

To address these issues, diffraction based focus (DBF) was devised. Diffraction based focus may use target forming features on the reticle which print targets designed to have a degree of asymmetry which is dependent on the focus setting during printing. This degree of asymmetry can then be measured using a scatterometery based inspection method, for example by measuring the intensity asymmetry between the intensities of $+1^{st}$ and $−1^{st}$ order radiation diffracted from the target, to obtain a measure of the focus setting. Such a method may be performed using the metrology tool illustrated in FIG. 3(a), for example.

Figures 3, 4:
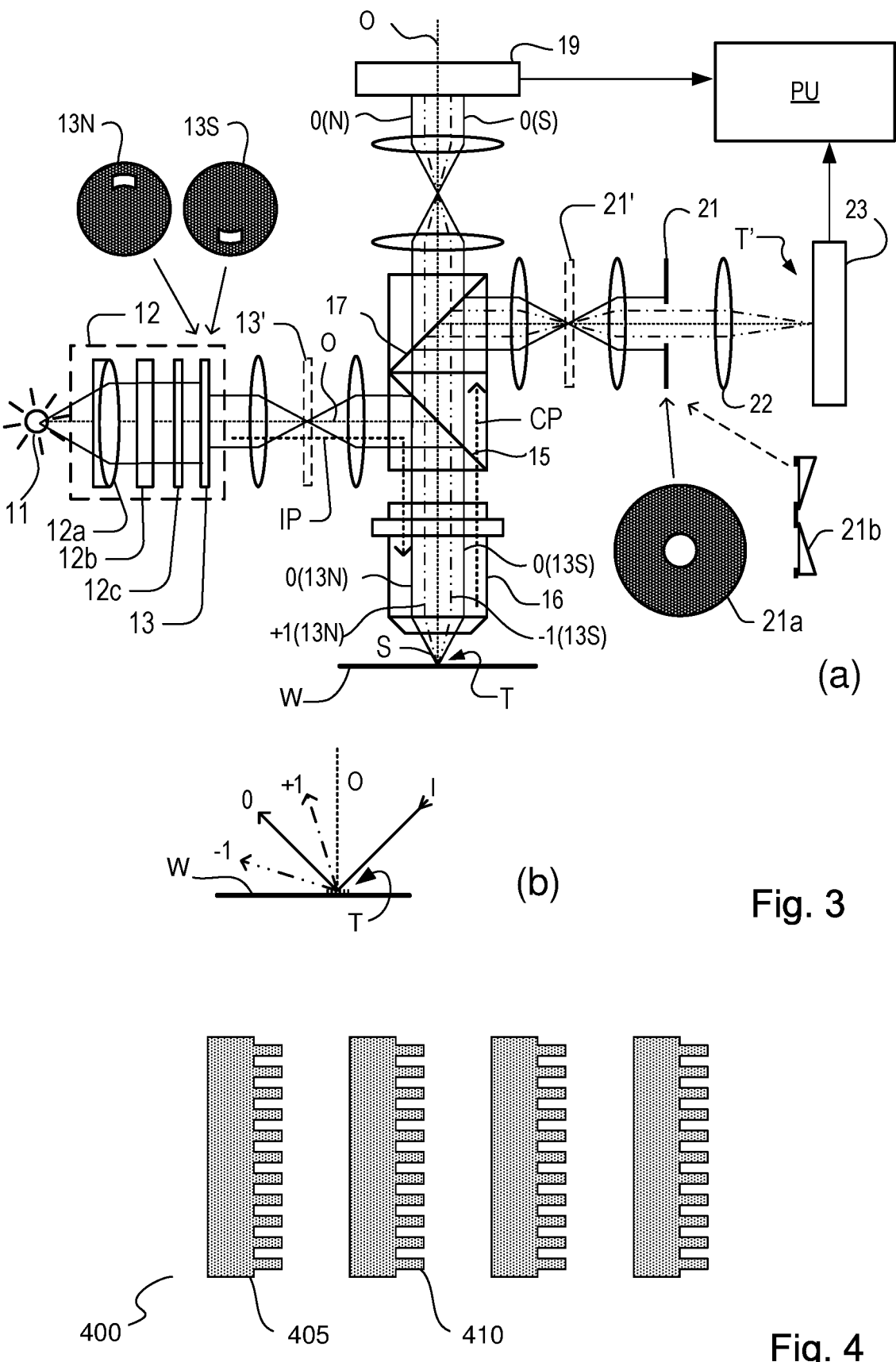
FIGS. 3(*a*)-(*b*) show (a) a schematic diagram of a dark field scatterometer for use in measuring targets according to embodiments of the invention using a first pair of illumination apertures and (b) a detail of diffraction spectrum of a target grating for a given direction of illumination.
FIG. 4 illustrates target forming elements on a reticle suitable for forming a grating on a substrate having focus dependent asymmetry.

FIG. 4 illustrates a purely exemplary DBF target forming design 400 configured for diffraction based focus measurements, to illustrate the basic concept. It comprises plural DBF structures 405, each of which comprises high resolution substructures 410. The high resolution substructures 410 on top of a base pitch creates an asymmetric resist profile for each DBF structure 405, with the degree of asymmetry being dependent upon focus. Consequently a metrology tool can measure the degree of asymmetry from a target formed using DBF target forming design 400 and translate this into the scanner focus.

The focus (DBF) metrology target should have a unique, and preferably monotonic, asymmetry signal as a function of target defocus. In this context, an asymmetry signal may describe a difference (e.g., an intensity and/or phase difference) in opposing higher diffraction orders (e.g., +1 and −1 diffraction orders).

It should be appreciated that the DBF target forming design 400 described above is a relatively simplistic example to illustrate the principle of DBF. Many different variations on this approach have been described, to achieve various improvements. Such improvements may comprise one or more of the following:

obtain better focus sensitivity, simultaneous dose measurement, minimize dose crosstalk, to remain within certain imposed design rules, to achieve a monotonic relationship between asymmetry and focus (e.g., a target based on a differential of two Bossung like signals with a focus shift between them) and/or to work in thin resists such as used in EUV lithography To have more similar characteristics to actual product structures (e.g., to be of a similar resolution).

WO2017/108395 and WO2019/110211 (which are both incorporated herein by reference) are two of numerous such examples of publications which describe a number of different diffraction based focus methods and target designs, all of which are applicable to the concepts which will be disclosed herein. As such, it will be appreciated that the type of target measured is not important, provided that the target has a focus dependent asymmetry such that an intensity asymmetry measurement can be used to infer back the focus setting used.

Present DBF methods have issues with accuracy due to numerous effects. Some DBF targets maintain Bossung behavior and therefore has low sensitivity around best focus were sensitivity is most important.

A particular issue, is the effect of dose and processing effects on the focus measurement. Dose and processing effects effectively acts as a crosstalk term on the focus inference, in that the intensity asymmetry signal typically used to infer focus from a target also comprises a dose and crosstalk dependency. The result of this is an effective dose which may differ from the dose setting used in a calibration. Therefore, a method is described herein which enables simultaneous inference of focus and dose, therefore obtaining a more accurate focus value which is appropriate for the effective dose. In addition, the dose information yielded by the method can itself be used for process monitoring. In particular, the method comprises inferring focus and dose from both an asymmetry metric (e.g., the intensity asymmetry or difference of complementary diffraction orders from the target, optionally normalized) and a sum metric (e.g., sum of the of complementary diffraction orders from the target).

The method may comprise constructing a focus-dose (more specifically: focus-effective dose) calibration relationship, which may comprise the form of a calibration plot or calibration grid or calibration plane based on the relationship between the asymmetry metric and sum metric; e.g., a plot of the sum metric against the asymmetry metric. The method then infers a focus value for an appropriate effective dose based on the focus-dose calibration grid; while also inferring the effective dose. Of course, an actual plot does not need to be constructed, rather the relationships determined numerically from the input data.

Presently, focus is inferred assuming a certain dose value (e.g., based on a previous calibration or assumed dose value, e.g., the dose setting used during the lithographic process). The inference is then based only on an asymmetry metric, e.g., a $\Delta$I metric (the difference of complementary orders) or $\Delta$I/I metric (the normalized difference of complementary orders). For example, a calibration curve of the asymmetry metric versus focus is determined in a calibration step (optionally for different dose levels) and is later used to infer back the focus based on an asymmetry measurement (e.g., at an assumed dose level).

To understand the concepts herein, it should be appreciated that the asymmetry metric has greatest inferency on focus, but also some dose/processing dependency and the sum metric has greatest dependency on dose and other processing factors (which affect the effective dose), but also some focus dependency. Therefore, by explicitly inferring focus and (effective) dose simultaneously, the focus inference result is less dependent on effective dose.

Figure 5:
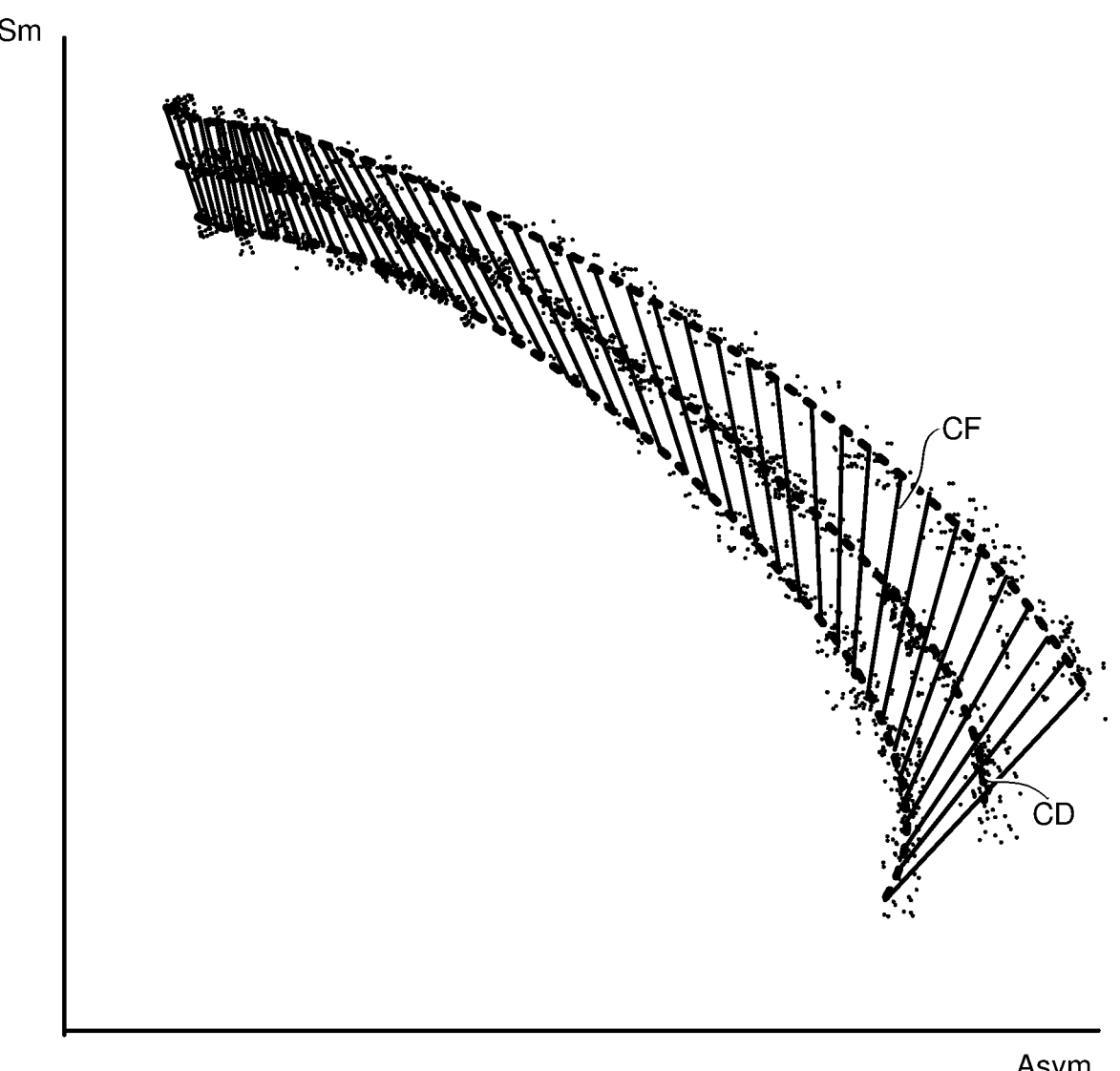
FIG. 5 is a plot of a sum metric against an asymmetry metric for calibration measurements at three dose levels and numerous focus level, which may be used in a focus inference method according to an embodiment of the invention.

FIG. 5 is a focus-dose calibration grid or {F, D} plot which can be constructed experimentally in a calibration phase. The figure shows a 4D plot of the sum metric Sm against the asymmetry metric Asym determined for (in this example) multiple focus levels and three dose levels. The dotted lines represent focus curves fitted to lines of constant dose CD for the three dose levels (i.e., each dotted line shows focus variation in {F, D} coordinate space for a constant dose). Each of the solid lines CF are dose curves represent a fitting to lines of constant focus (i.e., each solid line shows dose variation in {F, D} coordinate space for a constant focus). Only one each of these lines is labeled in the Figure. Note that the angle between the lines of constant dose CD and the lines of constant focus CF varies and is generally non-orthogonal.

Once constructed, the focus and dose can be inferred by reading from the plot the corresponding focus dose values {F, D} for a given asymmetry metric/sum metric pair. In particular, this is done by plotting a measurement point corresponding to the measured asymmetry metric/sum metric pair and inferring focus from a corresponding point on the appropriate constant dose curve (e.g., corresponding to an expected dose; such as the dose setting used) by following a line of constant focus CF from the measurement point to the constant dose curve. The dose can be inferred by the distance between the measurement point and the curve in this direction.

Figure 6:
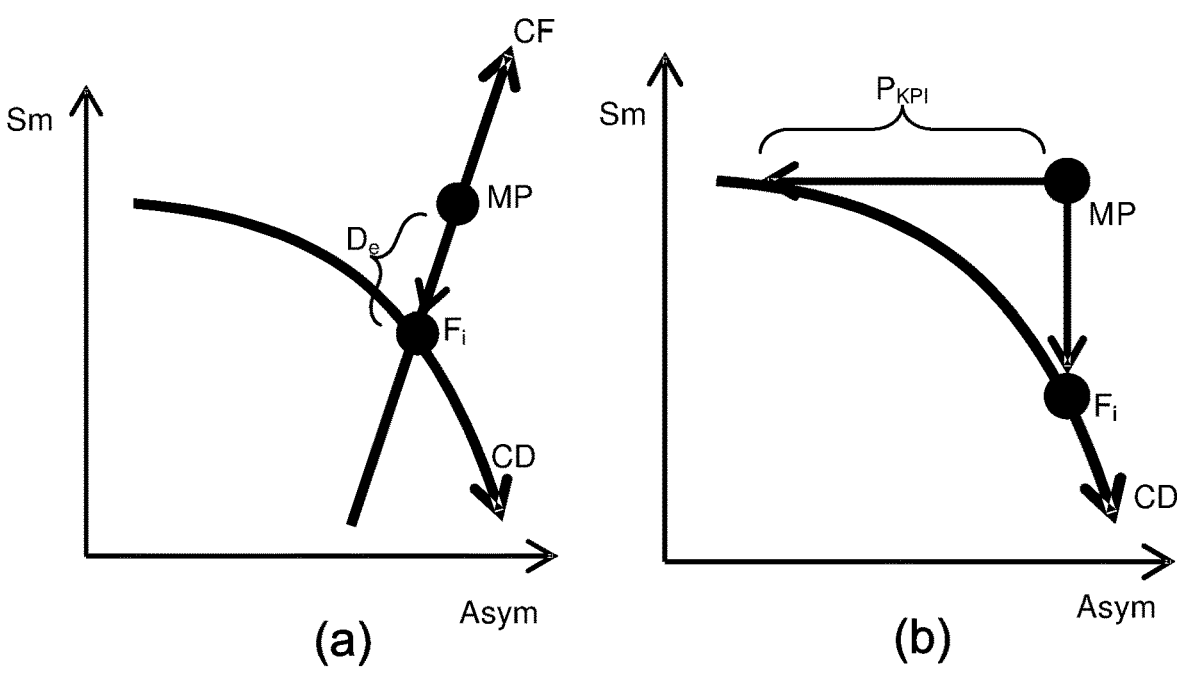
FIG. 6 is a plot of a sum metric against an asymmetry metric illustrating (a) a focus inference method according to an embodiment of the invention and (b) a prior art focus inference method.

FIG. 6(a) is a plot of sum metric against asymmetry metric illustrating this inference method, and FIG. 6(b) is an equivalent plot illustrating a present method (e.g., the focus which would be inferred using the asymmetry metric only) for comparison. FIG. 6(a) shows one constant dose curve CD and one constant focus line CF corresponding to a measurement point MP (i.e., which corresponds to a measured asymmetry metric and sum metric). The inferred focus value $F_i$ is the focus value on the constant dose curve CD corresponding to the measurement point MP in the direction of constant focus CF. Effective dose $D_e$ is the distance between measurement point and constant dose curve CD in this direction. In FIG. 6(b), the present situation is illustrated on an equivalent plot. In a present method, only the asymmetry metric is presently measured, from which the inferred focus value $F_i$ is directly inferred (i.e., the sum metric of measurement point MP is not used in the inference). A normalized distance process performance indicator $P_{KPI}$ is sometimes also calculated from summed intensity values for process monitoring; however up to now this has not been used in focus inference.

Figure 7:
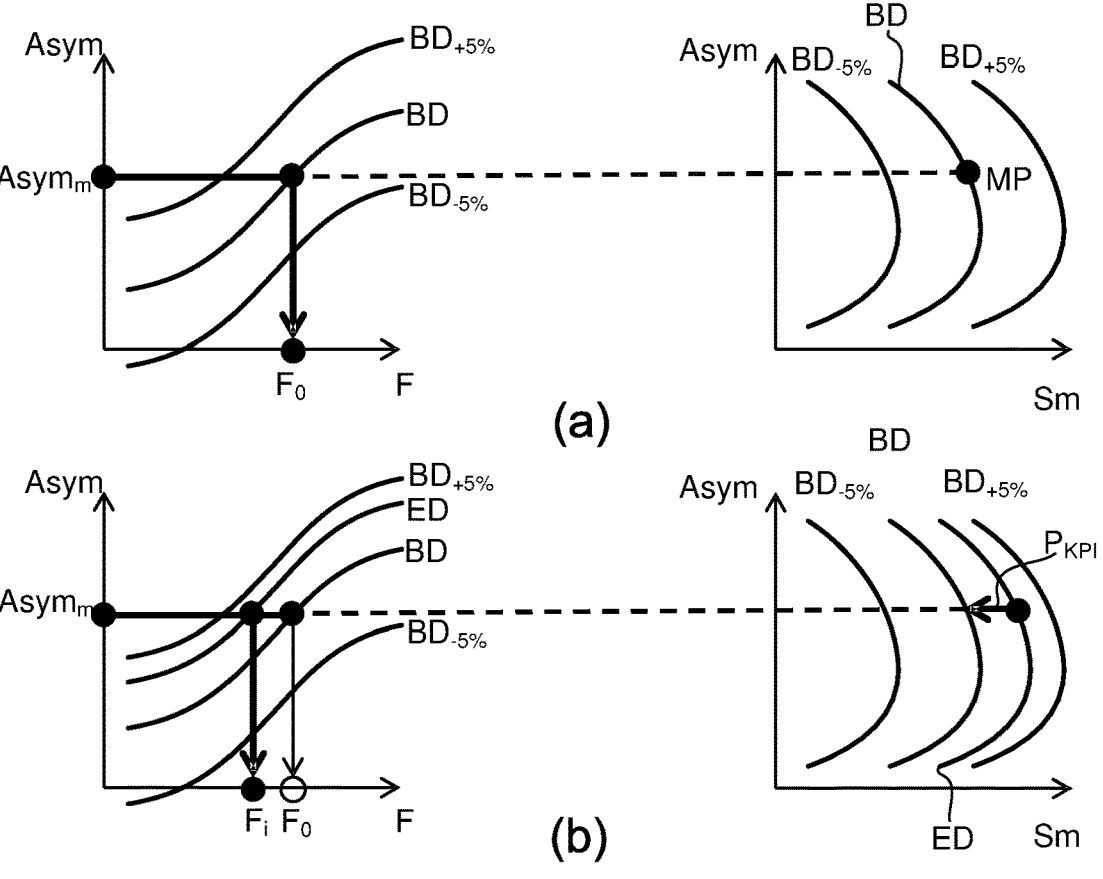
FIG. 7 shows (a) plots of an asymmetry metric against focus and against a sum metric illustrating a prior art focus inference method; and (b) plots of an asymmetry metric against focus and against a sum metric illustrating a focus inference method according to an embodiment of the invention.

FIG. 7 illustrates the problem with the current inference methodology. FIG. 7(a) illustrates the present method with assumed dose to be that as calibrated for. Shown is a plot of asymmetry metric Asym against focus F as may be presently used, and an equivalent asymmetry Asym against sum Sm plot. In each case, there are three calibrated curves, a best dose curve BD, and best dose +/−5% curves $BD_{+5\%}$, $BD_{-5\%}$. Best dose BD is the assumed dose in this inference. Therefore, a measured asymmetry $Asym_m$ results in the inferred focus value $F_0$ shown. Also shown is the equivalent measurement point MP in the Asymmetry vs Sum curve. FIG. 7(b) shows the effect of an effective dose ED being different to the assumed dose BD on the inferred focus value $F_0$. In each of the plots, there is an additional effective dose curve ED corresponding to the effective dose which differs from the assumed dose BD. The difference in the effective dose and the assumed dose results in a significant difference in the inferred focus value $F_0$ based on only an asymmetry metric and inferred focus value $F_i$ using the method disclosed herein. FIG. 7(b) also shows the same inference on an Asymmetry-Sum plot. The sum difference between the effective dose curve and assumed dose curve is the indicator described above as the normalized distance process performance indicator $P_{KPI}$, sometimes presently used in monitoring but not in focus inference.

Figure 8:
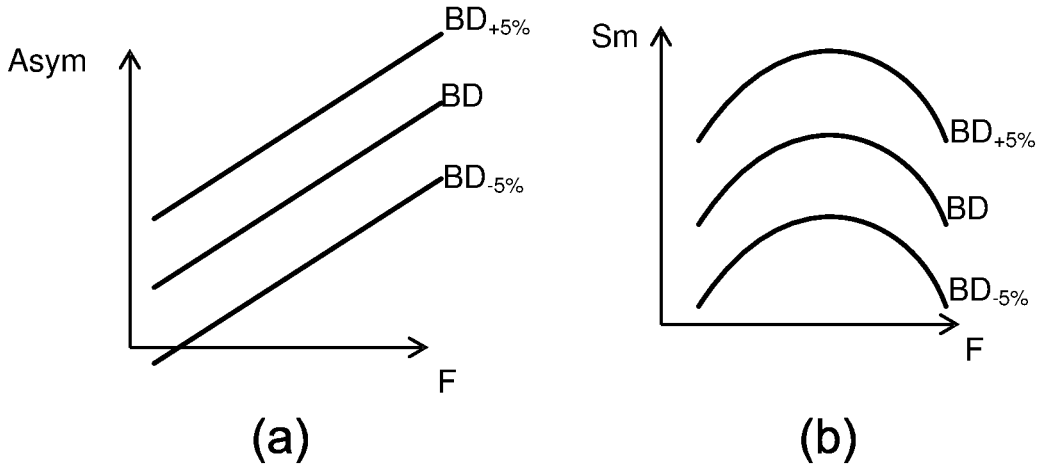
FIG. 8 shows (a) a plot of an asymmetry metric against focus, (b) a sum metric against focus and (c) a sum metric against an asymmetry metric illustrating how the focus inference method according to an embodiment of the invention is more accurate over prior art methods.
Figure 8:
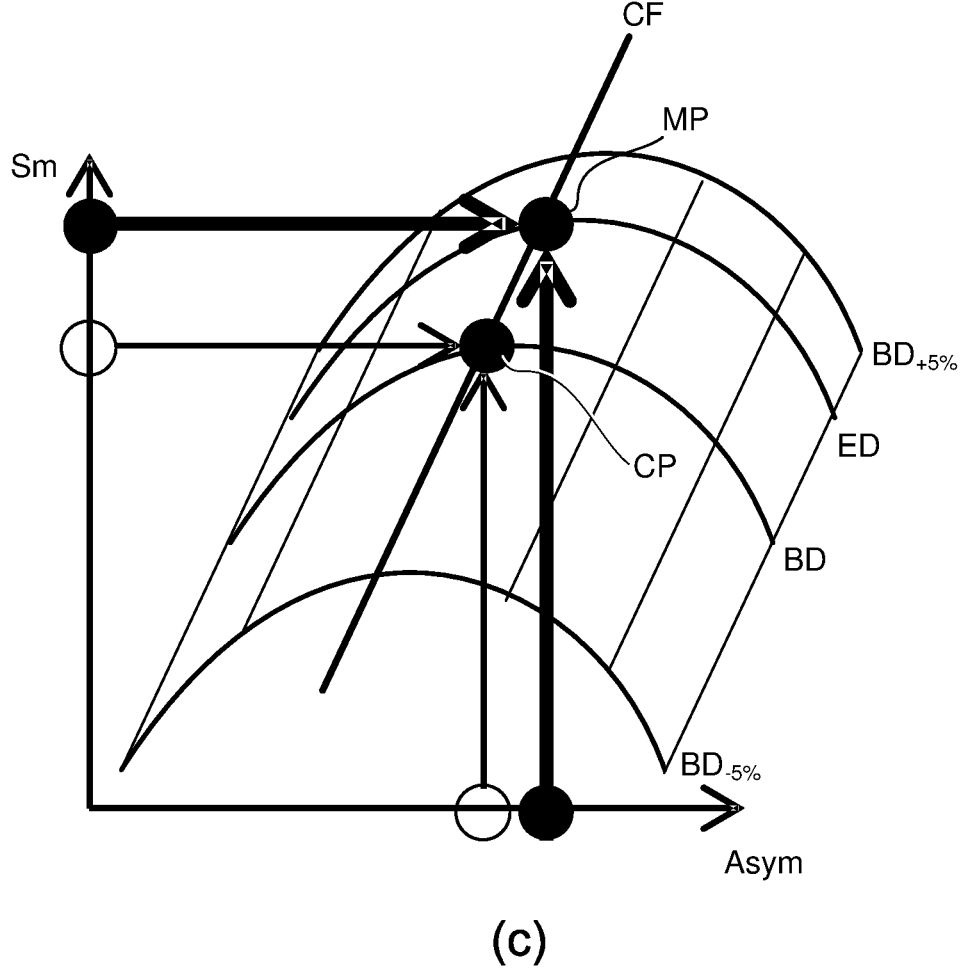

FIG. 8 illustrates how the proposed method, and the additional use of the sum metric, addresses the issue illustrated by FIG. 7. FIG. 8(a) is an asymmetry metric against focus plot for a simplified (i.e., linear) focus model. Once again, three dose levels are represented. Asymmetry Asym can be described by:

$$Asym = c1F + c2D$$

where F and D are focus and dose respectively and c1 and c2 are coefficients.

FIG. 8(b) shows the equivalent plot of sum Sm against focus F, where sum can be described by:

$$Sm = c3 + c4F^2 + c5D$$

where c4 and c5 are coefficients and c3 is a constant.

FIG. 8(c) shows that, by using the two metrics (asymmetry and sum), the process variation (e.g., due to dose and other processing effects) is actually modelled and compensated for. FIG. 8(c) is an equivalent sum vs asymmetry plot, with the addition of an effective dose curve ED. As can be seen, the inferred dose is the same for the measurement point MP, and an equivalent calibration point CP on the best dose BD curve (i.e., both points are on the same line of constant focus CF). If the effective dose changes, the inferred focus will be the same.

The calibration spans a {F, D} space in (asym,sm) domain, and the focus (and dose) inference comprises solving a set of equations:

$$c4F^2 - \frac{c1c5}{c2F} + \left(c3 + \frac{c5}{c2asym - sm}\right) = 0$$

$$D = \frac{(asym - c1F)}{c2}$$

Figure 9:
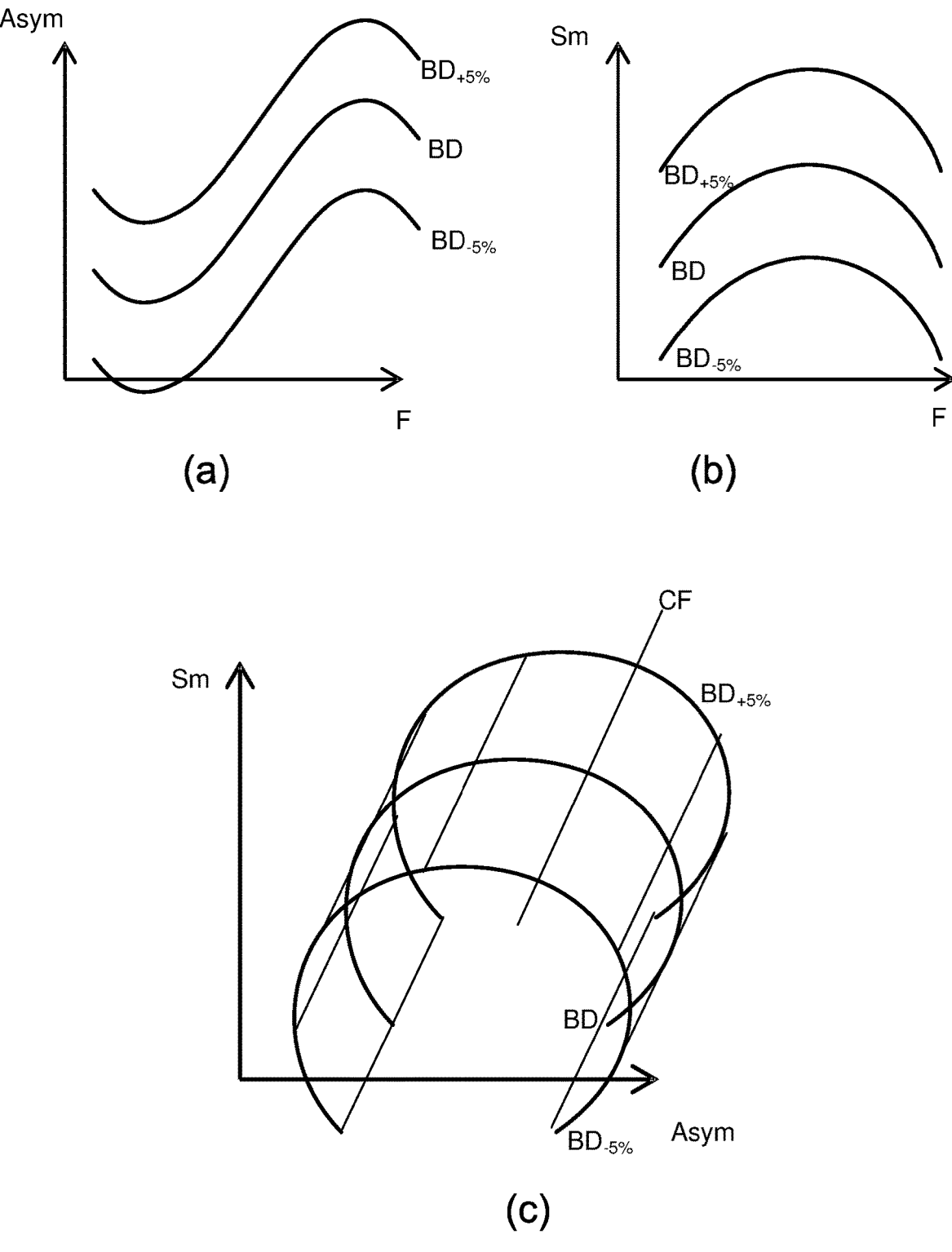
FIG. 9 shows (a) a plot of an asymmetry metric against focus, (b) a sum metric against focus and (c) a sum metric against an asymmetry metric illustrating how the focus inference method according to an embodiment of the invention extends the focus range compared to prior art methods.

Additionally, the method proposed herein may increase the effective focus inference range. In prior methods, the asymmetry metric is required to be unique (i.e., monotonous over a sufficient focus range). This presently limits target selection, and prohibits further focus range increase e.g., for 3D-NAND. In the present proposal, it is the combination of the asymmetry metric and sum metric which needs to be unique. This is typically the case over any full focus range which yields a printed target. This is illustrated by FIG. 9, which shows similar plots to that of FIG. 8, except that the asymmetry vs focus relationship (FIG. 9(a)) has a small linear range. The sum vs focus relationship FIG. 9(b) is quadratic as in FIG. 8(b). FIG. 9(c) shows that even in this case, unique focus inference is still possible. This does assume that the effective dose is small.

Figure 10:
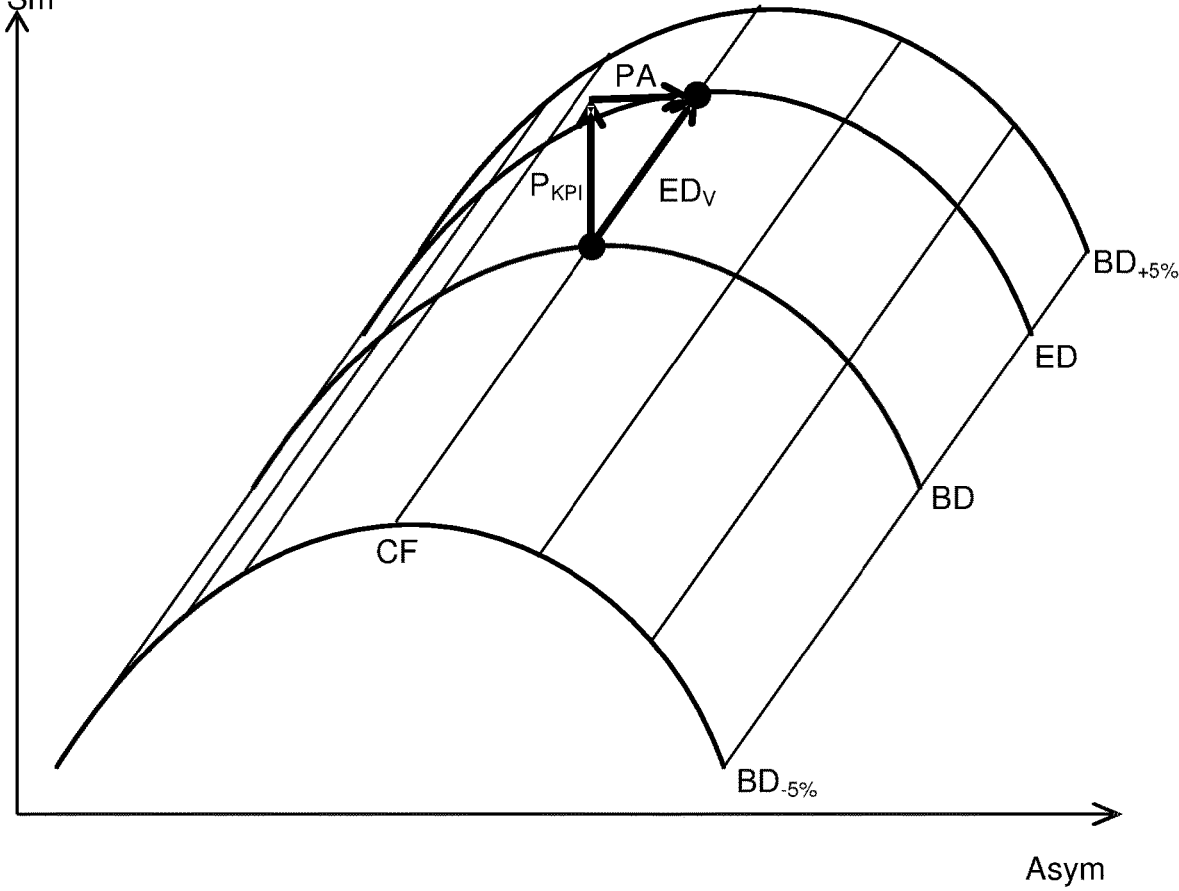
FIG. 10 is a plot of a sum metric against an asymmetry which illustrates the difference between a normalized distance process performance indicator $P_{KPI}$ known in the prior art and the effective dose obtained in a focus inference method according to an embodiment of the invention.

FIG. 10 is a sum vs asymmetry plot having curves for the three dose settings BD, BD$_{+5\%}$, BD$_{-5\%}$ and the effective dose curve ED, which illustrates the difference between the normalized distance process performance indicator P$_{KPI}$ and the effective dose obtained in this method. Shown are vectors representing the normalized distance process performance indicator P$_{KPI}$, the process asymmetry impact PA and the effective dose value ED$_y$. It can be appreciated that:

$$P_{KPI}^2 = ED^2 - PA^2$$

As such, if process affects the focus inference, it also reduces apparent normalized distance process performance indicator P$_{KPI}$. Therefore, effective dose is a better performance indicator with a clearer unit. However, P$_{KPI}$ remains a valid process flag.

It should be noted that the aforementioned principle will work on any cross term and any type on inference (including overlay for example). As such, adding an additional term which dominantly (or at least significantly) depends on the cross term, such as a sum term, can be used for inference of any lithographic processing parameter.

Therefore a method is disclosed which enables determination of a first processing parameter (e.g., focus) and a second processing parameter (e.g., dose), the method comprising: determining a first metric (e.g., an asymmetry metric) and a second metric (e.g., a sum metric) from measurement data, each of the first metric and second metric being dependent on both the first processing parameter and second processing parameter, the first metric showing a different dependence to the first processing parameter than the second processing parameter and the second metric showing a different dependence to the second processing parameter than the first processing parameter. The first processing parameter is subject to a coupled dependency of the second processing parameter. The first metric may show a stronger dependence to the first processing parameter than the second processing parameter and the second metric may show a stronger dependence to the second processing parameter than the first processing parameter The asymmetry metric may be based on a difference in intensity of complementary diffraction orders from diffraction of measurement radiation following measurement of a target formed with a focus dependent asymmetry. It may optionally be normalized. Complementary diffraction orders may comprise the positive and negative orders of the same indexed higher diffraction orders; e.g., +1 and −1 diffracted orders. The sum metric may comprise the sum of the intensities of the same complementary diffraction orders (e.g., from the same measurement). Where the target is a dual focus target, the dual target sum metric may comprise the difference of master sum and slave sum.

The methods disclosed herein result in one or more of:

an improved robustness of the focus inference, because processing and contrast behave as effective dose;

increased usable focus range;

explicit inference of effective dose (can be used for process monitoring); and possible improved scanner-to-scanner and metrology tool-to-metrology tool robustness.

Further embodiments are disclosed in the subsequent numbered clauses:

1. A method of inferring a value for a first processing parameter of a lithographic process, the first processing parameter being subject to a coupled dependency of a second processing parameter, the method comprising:
   determining a first metric and a second metric from measurement data relating to at least one structure on a substrate formed using the lithographic process, each of the first metric and second metric being dependent on both the first processing parameter and second processing parameter, the first metric having a stronger dependence on the first processing parameter than the second processing parameter and the second metric having a stronger dependence on the second processing parameter than the first processing parameter; and
   inferring the value for the first processing parameter from said first metric and second metric.

2. A method as defined in clause 1, comprising inferring a value for the second processing parameter of the lithographic process from said first metric and second metric.

3. A method as defined in clause 1 or 2, wherein the first metric comprises an asymmetry metric based on a difference in intensity of complementary diffraction orders from diffraction of measurement radiation following measurement of the at least one structure.

4. A method as defined in clause 3, wherein the second metric comprises a sum metric based on the sum of the intensities of said complementary diffraction orders.

5. A method as defined in any preceding clause, wherein the at least one structure comprises a target having been formed with a focus dependent asymmetry, and said first processing parameter comprises focus during formation of said target.

6. A method as defined in clause 5, wherein said second processing parameter comprises effective dose during formation of said target.

7. A method as defined in any preceding clause, wherein said inferring step comprises referring to a calibration relationship describing the relationship of the first metric against the second metric for different values of said first processing parameter and said second processing parameter.

8. A method as defined in clause 7, wherein said inferring step comprising inferring a value for the first processing parameter at a point on a calibration plane fitted to a constant value for the second processing parameter, the point on the calibration plane corresponding, in a direction defined by a constant value for the first processing parameter, to a measurement point described by the first metric and second metric.

9. A method as defined in clause 8, wherein the calibration plane fitted to a constant value for the second processing parameter is fitted to a set value for the second processing parameter.

10. A method as defined in clause 8 or 9, further comprising a step of inferring a value for said second processing parameter from the distance between the measurement point and the calibration plane in said direction defined by a constant value for the first processing parameter.

11. A method as defined in any of clauses 7 to 10, further comprising determining said calibration relationship based on calibration measurements at different values for said first processing parameter and said second processing parameter.

12. A method as defined in any of clauses 7 to 11, wherein the calibration relationship comprises a calibration plot of the first metric against the second metric for different values of said first processing parameter and said second processing parameter.

13. A method of inferring a focus value from a target having been formed with a focus dependent asymmetry, relating to focus during formation of said target in a lithographic process, the method comprising:

determining an asymmetry metric and a sum metric from measurement data, the asymmetry metric being based on a difference in intensity of complementary diffraction orders from diffraction of measurement radiation following measurement of the target; and the sum metric is based on the sum of the intensities of said complementary diffraction orders; and inferring the focus value from said asymmetry metric and said sum metric.

14. A method as defined in clause 13, wherein said inferring step comprises referring to a calibration relationship describing the relationship of said asymmetry metric and said sum metric for different focus values and different dose values.

15. A method as defined in clause 14, wherein said inferring step comprising inferring the focus value at a point on a calibration plane fitted to a constant dose value, the point on the calibration plane corresponding, in a direction defined by a constant focus value, to a measurement point described by the asymmetry metric and the sum metric.

16. A method as defined in clause 15, wherein the calibration plane fitted to a constant dose value is fitted to a set dose value.

17. A method as defined in clause 16, further comprising a step of determining the effective dose during formation of said target from the distance between the measurement point and the calibration plane in said direction defined by a constant focus value.

18. A method as defined in any of clauses 14 to 17, further comprising constructing said calibration relationship based on calibration measurements at different focus values and dose values.

19. A method as defined in any of clauses 14 to 18, wherein the calibration relationship comprises a calibration plot of said asymmetry metric and said sum metric for different focus values and different dose values.

20. A method of determining a calibration plane for performing a calibration in a lithographic process; the method comprising:

determining a calibration relationship based on calibration measurements relating to at least one structure on a substrate formed using the lithographic process at different values for a first processing parameter and a second processing parameter, the calibration relationship describing the relationship of a first metric against a second metric for different values of said first processing parameter and said second processing parameter, wherein each of the first metric and second metric is dependent on both the first processing parameter and second processing parameter, the first metric having a stronger dependence on the first processing parameter than the second processing parameter and the second metric having a stronger dependence on the second processing parameter than the first processing parameter; and fitting a calibration plane to a constant value for the second processing parameter.

21. A method as defined in clause 20, wherein the first metric comprises an asymmetry metric based on a difference in intensity of complementary diffraction orders from diffraction of measurement radiation following measurement of the at least one structure.

22. A method as defined in clause 21, wherein the second metric comprises a sum metric based on the sum of the intensities of said complementary diffraction orders.

23. A method as defined in any of clauses 20 to 22, wherein the at least one structure comprises a target having been formed with a focus dependent asymmetry, and said first processing parameter comprises focus during formation of said target.

24. A method as defined in clause 23, wherein said second processing parameter comprises effective dose during formation of said target.

25. A metrology apparatus for measuring a parameter of a lithographic process, the metrology apparatus being operable to perform the method of any of clauses 1 to 24.

26. A metrology apparatus as defined in clause 25, comprising:

a support for said substrate having a plurality of targets thereon;

an optical system for measuring each target; and a processor.

27. A lithographic system comprising:

a lithographic apparatus comprising:

an illumination optical system arranged to illuminate a pattern;

a projection optical system arranged to project an image of the pattern onto a substrate; and a metrology apparatus according to clause 25 or 26, wherein the lithographic apparatus is arranged to use the inferred value for the first processing parameter or inferred focus parameter in determining control corrections when applying the pattern to further substrates.

28. A computer program comprising processor readable instructions which, when run on suitable processor controlled apparatus, cause the processor controlled apparatus to perform the method of any one of clauses 1 to 24.

29. A computer program carrier comprising the computer program of clause 28.

30. A method of manufacturing devices wherein a device pattern is applied to a series of substrates using a lithographic process, the method including:

using the method of any of clauses 1 to 24 to monitor said first processing parameter or focus parameter, and controlling the lithographic process for later substrates in accordance with the inferred value for said first processing parameter or inferred focus parameter.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The term target or focus target should not be construed to mean only dedicated targets formed for the specific purpose of metrology or focus metrology respectively. The term target should be understood to encompass any suitable structures on a substrate including product structures, which have properties suitable for metrology applications.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method of inferring a value for a first processing parameter and a value for a second processing parameter of a lithographic process, the method comprising:
   determining a first metric and a second metric from measurement data relating to at least one structure on a substrate formed using the lithographic process, each of the first metric and second metric being dependent on both the first processing parameter and the second processing parameter, the first metric having a different dependence on the first processing parameter than the second processing parameter and the second metric having a different dependence on the second processing parameter than the first processing parameter; and
   inferring the value for the first processing parameter and the value for the second processing parameter based on a relationship of the first metric against the second metric, or vice versa.

2. The method as claimed in claim 1, wherein the first metric has a stronger dependence on the first processing parameter than the second processing parameter.

3. The method as claimed in claim 1, wherein the second metric has a stronger dependence on the second processing parameter than the first processing parameter.

4. The method as claimed in claim 1, wherein the first metric comprises an asymmetry metric based on a difference in intensity of complementary diffraction orders from diffraction of measurement radiation following measurement of the at least one structure.

5. The method as claimed in claim 4, wherein the second metric comprises a sum metric based on a sum of the intensities of the complementary diffraction orders.

6. The method as claimed in claim 1, wherein the at least one structure comprises a target having been formed with a focus dependent asymmetry, and the first processing parameter comprises focus during formation of the target.

7. The method as claimed in claim 1, wherein the second processing parameter comprises effective dose during formation of the target.

8. The method as claimed in claim 1, wherein the inferring comprises referring to a calibration relationship describing the relationship of the first metric against the second metric for different values of the first processing parameter and the second processing parameter.

9. A metrology apparatus for measuring a parameter of a lithographic process, the metrology apparatus configured to perform the method of claim 1.

10. A lithographic system comprising:
   a lithographic apparatus comprising a projection optical system arranged to project an image of a pattern onto a substrate; and
   the metrology apparatus according to claim 9,
   wherein the lithographic apparatus is arranged to use the inferred value for the first processing parameter or for the second processing parameter in determining a control correction when applying the pattern to further substrates.

11. A computer program product comprising a non-transitory computer-readable medium having processor readable instructions therein, the instructions, when run on a suitable processor controlled apparatus, are configured to cause the processor controlled apparatus to perform the method of claim 1.

12. A method of manufacturing devices wherein a device pattern is applied to a series of substrates using a lithographic process, the method including:
   using the method of claim 1 to monitor the first processing parameter or second processing parameter, and
   controlling the lithographic process for later substrates in accordance with the inferred value for the first processing parameter or second processing parameter.

13. A method of inferring a focus value from a target having been formed with a focus dependent asymmetry, relating to focus during formation of the target in a lithographic process, and inferring a value of effective dose during formation of the target, the method comprising:
   determining an asymmetry metric and a sum metric from measurement data, the asymmetry metric being based on a difference in intensity of complementary diffraction orders from diffraction of measurement radiation following measurement of the target, and the sum metric is based on a sum of the intensities of the complementary diffraction orders; and
   inferring the focus value and the value of effective dose from a relationship of the asymmetry metric against the sum metric, or vice versa.

14. A computer program product comprising a non-transitory computer-readable medium having processor readable instructions therein, the instructions, when run on a suitable processor controlled apparatus, are configured to cause the processor controlled apparatus to perform the method of claim 13.

15. A metrology apparatus for measuring a parameter of a lithographic process, the metrology apparatus configured to perform the method of claim 13.

16. A method of manufacturing devices wherein a device pattern is applied to a series of substrates using a lithographic process, the method including:

using the method of claim 13 to monitor the focus value or the value of effective dose, and controlling the lithographic process for later substrates in accordance with the inferred focus value or inferred value of effective dose.

17. A method comprising:

determining a calibration relationship based on calibration measurements relating to at least one structure on a substrate formed using a lithographic process at different values for a first processing parameter and a second processing parameter, the calibration relationship describing a relationship of a first metric against a second metric for different values of the first processing parameter and the second processing parameter, wherein each of the first metric and second metric is dependent on both the first processing parameter and second processing parameter, the first metric having a stronger dependence on the first processing parameter than the second processing parameter and the second metric having a stronger dependence on the second processing parameter than the first processing parameter; and fitting a calibration plane for performing a calibration in the lithographic process to a constant value for the second processing parameter.

18. A computer program product comprising a non-transitory computer-readable medium having processor readable instructions therein, the instructions, when run on a suitable processor controlled apparatus, are configured to cause the processor controlled apparatus to perform the method of claim 17.

19. A metrology apparatus for measuring a parameter of a lithographic process, the metrology apparatus configured to perform the method of claim 17.

20. The method as claimed in claim 17, wherein the first processing parameter comprises focus during applying of a pattern using the lithographic process or the second processing parameter comprises effective dose during applying of a pattern using the lithographic process.

* * * * *